(12) United States Patent
Horanzy

(10) Patent No.: US 7,146,598 B2
(45) Date of Patent: Dec. 5, 2006

(54) METHOD AND APPARATUS FOR CONFIGURING A PROGRAMMABLE LOGIC DEVICE

(75) Inventor: Joseph Horanzy, Bensalem, PA (US)

(73) Assignee: Computer Network Technoloy Corp., Minneapolis, MN (US)

( * ) Notice: Subject to any disclaimer, the term of this patent is extended or adjusted under 35 U.S.C. 154(b) by 0 days.

(21) Appl. No.: 10/299,007

(22) Filed: Nov. 19, 2002

(65) Prior Publication Data

US 2004/0093488 A1    May 13, 2004

Related U.S. Application Data

(60) Provisional application No. 60/424,333, filed on Nov. 7, 2002.

(51) Int. Cl.
- *G06F 17/50* (2006.01)
- *G06F 1/24* (2006.01)
- *G06F 7/38* (2006.01)
- *G01R 31/28* (2006.01)
- *H03K 19/173* (2006.01)

(52) U.S. Cl. ......................... 716/16; 714/725; 713/100; 326/38; 326/39

(58) Field of Classification Search ................... 716/16, 716/17; 714/733, 725; 713/193, 100; 712/16; 710/8; 365/200; 326/38, 39, 105
See application file for complete search history.

(56) References Cited

U.S. PATENT DOCUMENTS

| 5,528,176 | A * | 6/1996 | Kean ............................. 326/105 |
| 6,297,666 | B1 * | 10/2001 | Weingartner et al. .......... 326/41 |
| 6,326,606 | B1 | 12/2001 | Nagamatsu |
| 6,326,806 | B1 * | 12/2001 | Fallside et al. ................ 326/38 |
| 6,501,677 | B1 * | 12/2002 | Rau et al. ..................... 365/154 |
| 6,625,796 | B1 * | 9/2003 | Rangasayee et al. .......... 716/17 |
| 6,631,520 | B1 * | 10/2003 | Theron et al. ................ 717/173 |
| 6,642,743 | B1 * | 11/2003 | Bal ............................... 326/37 |
| 6,785,165 | B1 * | 8/2004 | Kawahara et al. ..... 365/185.28 |
| 6,889,172 | B1 * | 5/2005 | Sierer et al. ................. 702/188 |
| 6,996,758 | B1 * | 2/2006 | Herron et al. ............... 714/726 |

(Continued)

FOREIGN PATENT DOCUMENTS

JP    2002100979 A  *  4/2002

OTHER PUBLICATIONS

Szymanski et al. "In-system reconfiguring and I2C controlling of FPGA based applications", Feb. 12-17, 2001, CAD Systems in Microelectronics, Proceedings of the 6th International Conference. The Experience of Designing and Application of pp. 230-231.*

*Primary Examiner*—A. M. Thompson
*Assistant Examiner*—Helen Rossoshek
(74) *Attorney, Agent, or Firm*—Beck & Tysver P.L.L.C.

(57) ABSTRACT

A method and apparatus for configuring multiple first programmable logic devices from a single memory includes a microprocessor, and a second programmable logic device containing the interface logic for the first programmable device and the microprocessor. The present invention allows multiple FPGAs to be programmed from a single memory structure under the control of the microprocessor thereby using fewer components than systems dedicating a separate memory to each FPGA. A communications port allows new configurations to be downloaded to the microprocessor memory. In addition, the present invention can be used in combination with standard systems with each FPGA having its own memory, with the microprocessor being able to select between the central microprocessor memory and the local memory for programming each FPGA.

32 Claims, 3 Drawing Sheets

U.S. PATENT DOCUMENTS

| | | | |
|---|---|---|---|
| 2002/0104051 A1* | 8/2002 | Gupta | 714/733 |
| 2003/0009242 A1* | 1/2003 | Bocchi | 700/61 |
| 2003/0204776 A1* | 10/2003 | Testin | 714/14 |
| 2003/0212940 A1* | 11/2003 | Wong | 714/725 |
| 2004/0060032 A1* | 3/2004 | McCubbrey | 716/16 |
| 2006/0004553 A1* | 1/2006 | Kodosky et al. | 703/2 |

* cited by examiner

METHOD AND APPARATUS FOR CONFIGURING A PROGRAMMABLE LOGIC DEVICE

PRIORITY

This application claims priority to the provisional U.S. patent application entitled, A Method and Apparatus for Configuring Programmable Logic Devices, filed Nov. 7, 2002, having a Ser. No. 60/424,333, the disclosure of which is hereby incorporated by reference.

FIELD OF THE INVENTION

The present invention relates generally to programmable logic devices. More particularly, the present invention relates to using, configuring and identifying logic devices with a minimum number of memory devices.

BACKGROUND OF THE INVENTION

The Field Programmable Gate Array (FPGA) is an integrated circuit (IC) that can be programmed in the field after manufacture. FPGAs are similar in principle to, but have vastly wider potential application than, programmable read-only memory (PROM) chips. FPGAs are used by engineers in the design of specialized ICs that can later be produced hard-wired in large quantities for distribution to computer manufacturers and end users. Ultimately, FPGAs might allow computer users to tailor microprocessors to meet their own individual needs. However, there are limitations in FPGAs that can affect a designer's decision to use them.

FPGAs are not only used in the designing of specialized ICs, FPGAs can also be incorporated into actual devices. One of the advantages in using FPGAs is that it enables the device to be multi-functional without having to increase the number of internal circuit components. Another advantage in using FPGAs is that logic configured therein is upgradeable. Instead of having to change the integrated chip, the existing FPGA can be reprogrammed with a new configuration. Therefore, FPGAs can be upgraded with logic that enables the device to be compatible with latest devices on the market. In the computer industry, this is a distinct advantage because the pace of the technology runs in about a five year cycle.

One of the disadvantages of using FPGAs is that currently each FPGA requires its own memory device. The memory device serves as the storage area for the configuration logic. The logic is placed into the FPGA and activated once the FPGA has been initialized. One disadvantage to having a separate memory device for each FPGA is the overall cost. Furthermore, memory prices have a tendency to fluctuate. This cost factor has an effect on cost effective design choices. The other disadvantage with the individual memory devices is the amount of space required on the circuit board. Circuit board space is a never ending battle especially when fitting multi-function devices within an enclosure that is satisfactory with the consumer. The addition of multiple FPGAs does not help the problem if each FPGA is required to have its own memory device. Furthermore, there is a redundancy in the system with memory devices storing the identical configuration logic for each FPGA.

Finally, an integrated chip such as an FPGA can malfunction and disrupt the operation of a system or device. With FPGAs, it is not possible to check the status or condition of the FPGA without pulling the FPGA from its slot. Further complicating the problem is the ability to detect whether the FPGA is the cause of the malfunction.

Accordingly, it is desirable to provide a system and method to reduce the number of storage devices used to configure an FPGA. The resulting benefit is the reduction of component costs and the increase in availability of real estate on the circuit board. There is an additional need to determine the status or functionality of the FPGAs.

SUMMARY OF THE INVENTION

The present invention provides a method and apparatus that enables a user to program multiple programmable logic devices with a minimum number of memory devices.

The present invention also provides a method and apparatus to detect the condition or status of the programmable logic device.

The above can be achieved through the use of a novel combination of a single memory device and a processor to program or configure multiple programmable logic devices. The memory serves as the location where the configuration code for the FPGAs is stored. This arrangement enables the user to save and potentially open up valuable real estate and reduces the drain on the power supply on a circuit board within a system. In accordance with one embodiment of the present invention, an apparatus for configuring a first programmable device includes a microprocessor, a second programmable logic with an interface logic to link the microprocessor and the first programmable logic device and a status check that is linked to the second programmable logic device. The status check determines the condition of the first programmable logic device. The final element is a memory device that is linked to the microprocessor. The memory device provides a configuration code for the first programmable logic device. In this embodiment, the first programmable logic device is a field programmable gate array (FPGA). while the second programmable device is a complex programmable logic device (CPLD). The FPGN's configuration code that is stored in the microprocessor's memory device can changed via the microprocessor's communication's port. This allows new configurations to be downloaded to the memory device.

In this embodiment, the microprocessor upon reset or boot-up sets a command in the configuration register of the second programmable logic device. In the instance of multiple FPGAs, the command instructs the second programmable device which, if any of the first programmable devices to program.

The present embodiment can also include a second memory device linked to the FPGA. The second programmable device (CPLD) contains the switching logic to program the first programmable logic device in a different configuration. The second memory device can be an individual memory device for each of the FPGAs. In this configuration, the microprocessor can selectively choose among the differing configuration codes that are currently present in any of the memory devices.

In an alternate embodiment of the present invention, a method for configuring a first programmable device contains the steps of de-asserting a reset line of the first programmable logic device, toggling the program reset line of the first programmable logic device, transmitting an initialization signal from the first programmable device to a microprocessor, determining the status of the first programmable logic device and downloading a configuration from the microprocessor's memory device to the first programmable device.

In another aspect of the present invention, a further step includes transmitting a completion status signal from the first programmable device to the microprocessor after the step of downloading is completed. The completion status signal indicates to the microprocessor that a successful download has been accomplished. The completion status signal can also indicate whether a fault condition is present or has occurred. If a fault condition is present, the alternate embodiment includes the step of re-downloading a configuration from the microprocessor's memory device to the first programmable device.

In the presence of a fault condition, the alternate embodiment includes the step of transmitting an alarm status to a user interface. The user interface can be an alphanumeric display, a light emitting diode or a serial port.

In this alternate embodiment, once a successful configuration is downloaded, the invention includes the steps of activating the first programmable logic device. One such method to activate the FPGA is to de-assert its logic-reset line. Once activated, the microprocessor initiates a system test on the FPGA by sending command sequences to the FPGA's interface register. The status is then sent back to the microprocessor to determine if first programmable logic device is operating properly. In the presence of a fault condition, the alternate embodiment includes the step of transmitting an alarm status to a user interface. The user interface can be an alphanumeric display, a light emitting diode or a serial port.

In another alternate embodiment, an apparatus for configuring a first programmable device includes means for de-asserting a reset line of a first programmable logic device, means for toggling the program line of the first programmable logic device, means for transmitting an initialization signal from the first programmable logic device to a microprocessor, means for determining the status of the first programmable logic device and means for downloading a configuration from the microprocessor's memory device to the first programmable logic device. This alternate embodiment can also include means for transmitting a completion status signal from the first programmable device to the microprocessor after the step of downloading is completed. The completion status signal can indicate a successful download of the configuration or a fault condition. If a fault condition is detected, then this alternate embodiment can include means for re-downloading a configuration from the microprocessor's memory device to the first programmable device.

Upon detecting the fault condition, the apparatus can contain means for transmitting an alarm status to a user interface. The user interface can be an alphanumeric display, a light emitting diode or a serial port.

Upon reset or boot-up of the microprocessor, the alternate embodiment can include means for activating the first programmable logic device, which in this alternate embodiment, is de-asserting the logic reset line.

The microprocessor also contains means for setting a command in the second programmable logic device. The command can be an instruction to the second programmable logic device which of the first programmable logic devices to download the configuration.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

Figure 1:
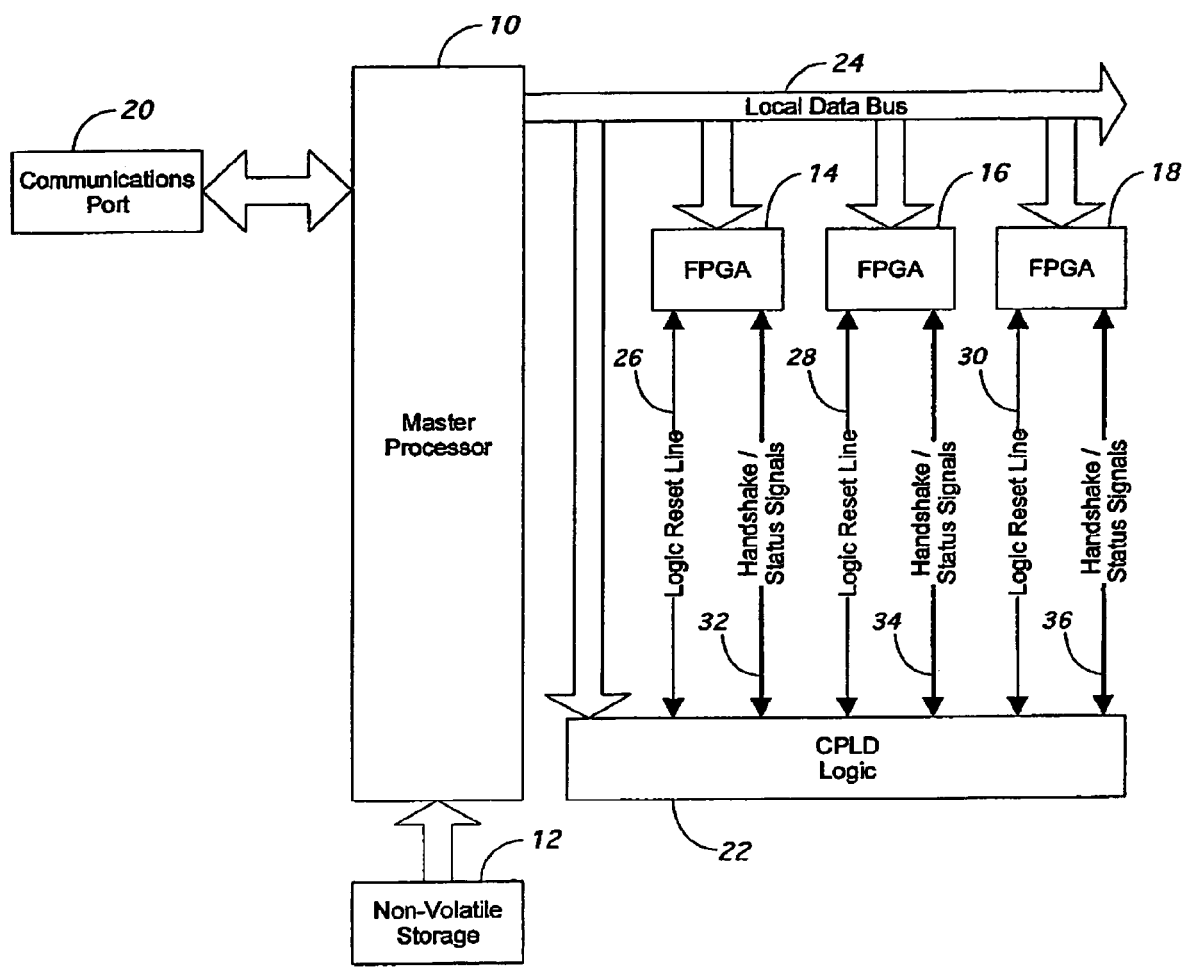
FIG. 1 is a block diagram of the present invention illustrating a central storage device for the programmable logic devices

A preferred embodiment of the present invention provides a method and apparatus that enables a user to check the status of a programmable logic device and program or configure this device in a manner that is intended or that the user desires. A preferred embodiment of the present inventive apparatus and method is illustrated in FIG. 1. In FIG. 1, the present invention includes a microprocessor 10, which is linked to storage device 12. The storage device 12 contains the application computer executable code, such as the boot code, and the configuration computer code for the field programmable gate arrays (FPGA) 14,16,18.

In the preferred embodiment, the storage device is non-volatil memory.

The preferred embodiment is connected to a communications port 20. In the preferred embodiment, the microprocessor 10 is linked to the communications port 20. The communications port 20 enables differing FPGA configurations to be downloaded to the storage device 12 via the microprocessor 10. From the storage device 12, the configuration code is downloaded to the various FPGAs 14,16, 18.

In order to allow the FPGAs 14, 16, 18 to communicate with microprocessor 10, a complex programmable logic device (CPLD) 22 is located between the two devices. The CPLD 22 contains the interface logic to enable the two devices to communicate. The CPLD 22 also contains the switching logic to program the multiple FPGAs 14,16,18.

The microprocessor 10 communicates over a local data bus 24 to the FPGAs 14, 16, 18 and to the CPLD 22. Through the bus line 24, the microprocessor 10 has the ability to update, change and/or reconfigure the FPGAs' logical functions.

After a system is initialized or through a boot-up, the initial condition of the reset lines 26,28,30 of the FPGAs 14,16,18 are held asserted. The microprocessor 10 then sets a command in a configuration register of the CPLD 22 to instruct which of the FPGAs 14,16,18 are to be programmed. After the CPLD 22 is instructed as to which of the FPGAs 14, 16, 18 to program, the CPLD 22 directs the appropriate control signals to that FPGA 14, which includes toggling the FPGA's program reset signal. Note that the program-reset signal is different from the FPGA's logic reset.

In response to the program reset signal, the FPGA 14 transmits an initialization status bit to the microprocessor 10 through the CPLD 22. Once this is received, the microprocessor 10 begins to start downloading the configuration sequence to the FPGA 14 from the storage device 12. Upon completion of this configuration sequence, the microprocessor 10 receives a completion or done bit from the FPGA 14 via the CPLD 22. The completion bit informs the microprocessor 10 that the FPGA 14 was properly programmed. If the completion bit shows a fault condition, the microprocessor 10, in the preferred embodiment, performs another download of the sequence configuration from the storage device.

At some point in the downloading process, the microprocessor 10 is instructed to report the error. In the preferred embodiment, the microprocessor 10 reports the error after two unsuccessful downloads that result in a fault condition that cannot be corrected. The report sends an alarm status to a user interface such as an alphanumeric display, LED or a serial port or a terminal.

After a successful download configuration to the FPGA 14, the FPGA 14 is activated. In the preferred embodiment, the microprocessor 10 activates the FPGA 14 with the new logic configuration by de-asserting the logic re-set line 26. Once activated, the microprocessor 10 tests the FPGA 14 and, if applicable, its surrounding circuitry by sending command sequences to the FPGAs interface register. The FPGAs 14,16,18 are assessed as to their status by using handshake/status signals 32,34,36. The microprocessor 10 requests status back through the predetermined registers in the FPGA 14. If the status is not what is expected, the microprocessor 10 transmits an alarm status indicating what section of the circuitry failed via the user interface.

The above configuration is also beneficial in a system where the power source is not large enough to program large multiple FPGAs concurrently. The microprocessor 10 can selectively program the FPGAs in a sequence, which is beneficial in reducing overall drain on a power supply during configuration. In other words, the present invention can program the FPGAs 14, 16, 18 either simultaneously or one at a time.

Figure 2:
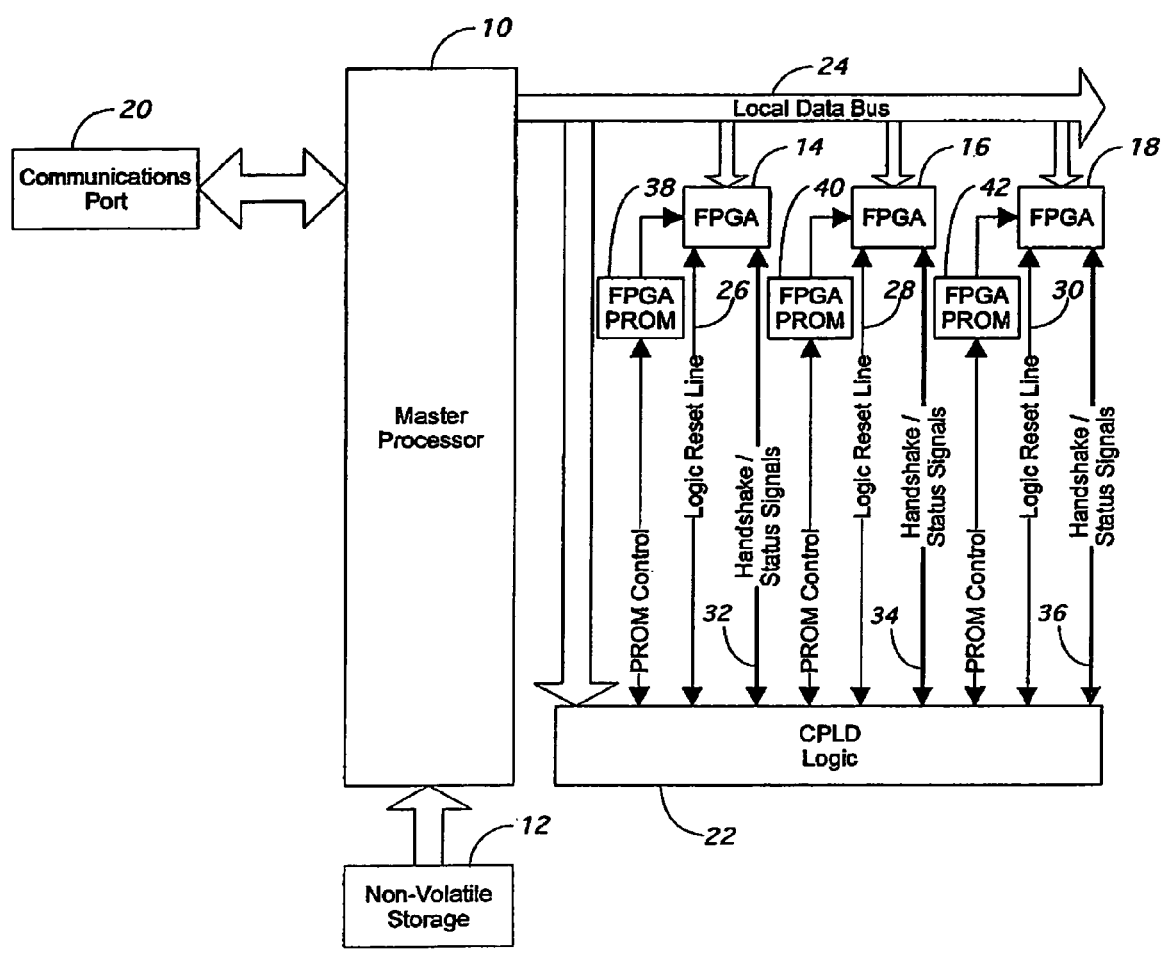
FIG. 2 is a block diagram of an alternate embodiment of the present invention illustrating a central storage device as well as individual storage devices for programmable logic devices.

FIG. 2 is a block diagram of an alternate embodiment of the present invention illustrating a central storage device and individual storage device for each programmable logic device. In this alternate embodiment as with the preferred embodiment in FIG. 1, the microprocessor 10 is linked to the FPGAs 14, 16, 18 through the CPLD 22. Attached to the microprocessor 10 is a storage device 12 and a communications port 20. The difference in this alternate embodiment is the inclusion of FPGA storage devices 38, 40, 42 with the FPGAs 14,16,18. In this alternate embodiment, the microprocessor 10 is able to control where the FPGAs 14,16,18 obtain its configuration code. The configuration code can be pulled from the FPGAs 14,16,18 own storage device 38,40, 42 or from a central location such as the storage device 12 that is attached to the microprocessor 10.

This alternate embodiment enables the FPGAs 14,16,18 to have the ability to have a primary configuration stored in its storage device 38,40,42 and then be able to switch to a secondary configuration logic by downloading the configuration data stored in the storage device 12, which is attached to the microprocessor 10. The alternate embodiment can also be configured so that the FPGAs 14,16,18 are initialized with the configuration data stored in its own storage device 38,40,42. The alternate embodiment can also be programmed to initialize the FPGAs 14,16,18 with the configuration data stored in the storage device 12 attached to the microprocessor 10. The benefit of such a configuration enables a device to be multifunctional without the need for a different component set.

Figure 3:
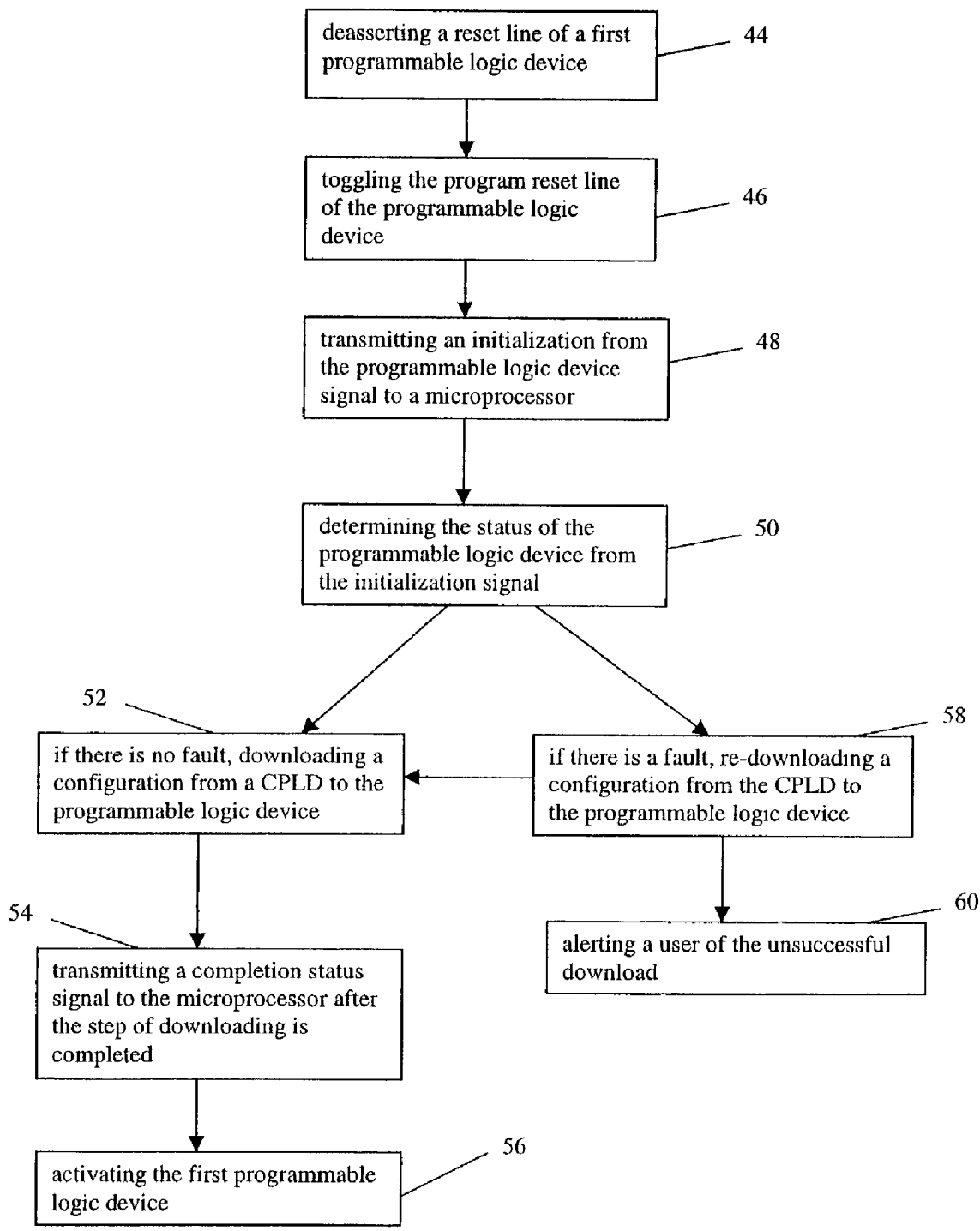
FIG. 3 is a flow diagram of the present invention.

FIG. 3 is a flow diagram of the present invention. The present invention begins the process by the step 44 of de-asserting a reset line of a FPGA. This step ensures that the FPGA is not initialized with any configuration data already within it. In other words, the FPGA is instructed to withhold initializing any configuration logic until another instruction is given. This enables the present invention to begin the process of programming the FPGA only when desired. To accomplish this task, the step 46 of toggling the program-reset line of the programmable logic device is undertaken. From this point, the step 48 of transmitting an initialization signal is received by the microprocessor 10 from the FPGA. The initialization signal enables the present invention to perform the step 50 of determining the status of the first programmable logic device from the initialization signal. After a determination is made and no fault is detected, the present invention proceeds to the step 52 of downloading a configuration from the microprocessor's memory device to a FPGA or a first programmable logic device. Once the download has been completed, the FPGA completes the step 54 of transmitting a completion status signal to the microprocessor. If the status signal indicates a successful download, then the present invention proceeds to the step 56 of activating the first programmable logic device. If the status signal does not indicate a successful download, then the present invention proceeds to the step 58 of re-downloading a configuration data from the CPLD. The present invention further includes the step 60 of alerting a user of the unsuccessful download. The alert can be through a user interface such as alphanumeric display, and LED or a serial port.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for configuring a plurality of programmable logic devices connected to a local data bus from a single memory device comprising the steps of:

communicating by a microprocessor connected to the local data bus through a communication port to which the microprocessor is directly connected;

signaling a reset line on all of the programmable logic devices;

selecting one of the programmable logic devices;

toggling a program reset line on the selected programmable logic device;

transmitting an initialization signal from the selected programmable logic device to the microprocessor;

determining the status of the selected programmable logic device from the initialization signal;

downloading a configuration from the single memory device connected to the microprocessor to the selected programmable logic device if there is no fault; and selecting a second one of the programmable logic devices and performing the steps of toggling, transmitting, determining, and downloading on the second selected programmable logic device.

2. The method as in claim 1, further comprising the step of transmitting a completion status signal from the selected programmable device to the microprocessor after the step of downloading is completed.

3. The method as in claim 2, wherein the completion status signal indicates a successful download of the configuration.

4. The method as in claim 2, wherein the completion status signal indicates a fault condition.

5. The method as in claim 4, further comprising re-downloading a configuration from the single memory device to the selected programmable logic device.

6. The method as in claim 4, further comprising the step of transmitting an alarm status to a user interface.

7. The method as in claim 6, wherein the user interface is an alphanumeric display.

8. The method as in claim 6, wherein the user interface is a light emitting diode.

9. The method as in claim 6, wherein the user interface is a serial port.

10. The method of claim 6, wherein the step of transmitting an alarm status to a user interface is performed by communicating by the microprocessor through the communication port.

11. The method as in claim 1, further comprising the step of activating the programmable logic device.

12. The method as in claim 11, wherein the step of activating is accomplished by the step of de-asserting the logic reset line.

13. The method as in claim 1, further comprising the step of using an additional logic device to control reset lines of the plurality of programmable logic devices, and further comprising the microprocessor setting a command in the additional logic device.

14. The method as in claim 13, wherein the command is an instruction as to which programmable logic device is to be selected.

15. The method of claim 1, further comprising:
activating a designated programmable logic device that is a Field Programmable Gate Array (FPGA);
sending a command sequence from the microprocessor to an interface register in the FPGA to functionally test the FPGA;
evaluating a status signal by the microprocessor from the FPGA device; and
upon detection of a failure, transmitting a report through the communication port.

16. The method of claim 1, wherein the step of communicating by the microprocessor includes receiving the configuration through the communication port, and further comprising:
transferring the configuration from the microprocessor to the single memory device.

17. An apparatus for configuring a plurality of programmable logic devices connected to a local data bus from a single memory device comprising:
means for communicating by a microprocessor connected to the local data bus through a communication port to which the microprocessor is directly connected;
means for signaling a reset line on all of the programmable logic devices;
means for selecting one of the programmable logic devices;
means for toggling a program reset line on the selected programmable logic device;
means for transmitting an initialization signal from the selected programmable logic device to the microprocessor;
means for determining the status of the selected programmable logic device from the initialization signal;
means for downloading a configuration from the single memory device, which is connected to the microprocessor, to the selected programmable logic device if there is no fault; and
means for selecting a second one of the programmable logic devices and performing the steps of toggling, transmitting, determining, and downloading on the second selected programmable logic device.

18. The apparatus as in claim 17, further comprising means for transmitting a completion status signal from the selected programmable device to the microprocessor after the step of downloading is completed.

19. The apparatus as in claim 18, wherein the completion status signal indicates a successful download of the configuration.

20. The apparatus as in claim 18, wherein the completion status signal indicates a fault condition.

21. The apparatus as in claim 20, further comprising means for re-downloading a configuration from the single memory device to the selected programmable device.

22. The apparatus as in claim 20, further comprising means for transmitting an alarm status to a user interface.

23. The apparatus as in claim 22, wherein the user interface is an alphanumeric display.

24. The apparatus as in claim 22, wherein the user interface is a light emitting diode.

25. The apparatus as in claim 22, wherein the user interface is a serial port.

26. The apparatus as in claim 22, wherein transmitting the alarm to the user interface is performed by communicating by the microprocessor through the communication port.

27. The apparatus as in claim 17, further comprising means for activating the selected programmable logic device.

28. The apparatus as in claim 27, wherein the means for activating de-asserts the logic reset line.

29. The apparatus as in claim 17, further comprising means for using an additional logic device to control reset lines of the plurality of programmable logic devices, and further comprising means for setting a command in the additional logic device.

30. The apparatus as in claim 29, wherein the command is an instruction as to which programmable logic device is to be selected.

31. The apparatus as in claim 17, further comprising:
means for activating a designated programmable logic device that is a Field Programmable Gate Array (FPGA);
means for sending a command sequence from the microprocessor to an interface register in the FPGA to functionally test the FPGA;
means for evaluating a status signal by the microprocessor from the FPGA device; and
upon detection of a failure, means for transmitting a report through the communication port.

32. The apparatus as in claim 17, further comprising:
means for receiving the configuration by the microprocessor through the communication port; and
means for sending the configuration from the microprocessor to the memory device.

* * * * *